United States Patent [19]

Leonardi et al.

[11] Patent Number: 5,796,156
[45] Date of Patent: Aug. 18, 1998

[54] HIGH-VOLTAGE SEMICONDUCTOR DEVICE WITH INTEGRATED EDGE STRUCTURE AND ASSOCIATED MANUFACTURING PROCESS

[75] Inventors: Salvatore Leonardi, Aci S. Antonio; Davide Bolognesi, Argenta, both of Italy

[73] Assignee: Consorzio per la Ricerca sulla Microelettronica nel Mezzogiorno, Cantania, Italy

[21] Appl. No.: 671,851

[22] Filed: Jun. 28, 1996

[30] Foreign Application Priority Data

Jul. 31, 1995 [EP] European Pat. Off. .............. 95830343

[51] Int. Cl.⁶ ................................................ H01L 23/58
[52] U.S. Cl. ........................ 257/494; 257/491; 257/495
[58] Field of Search .................................. 257/491, 492, 257/493, 494, 495, 496

[56] References Cited

U.S. PATENT DOCUMENTS 4,667,393  5/1987  Ferla et al. ...................... 29/56 B
4,780,430  10/1988  Musumici et al. ................... 437/51

FOREIGN PATENT DOCUMENTS 0571027  11/1993  European Pat. Off. ...... H01L 29/784
58-192369  11/1983  Japan ........................... H01L 29/06
3147331  6/1991  Japan ............................ H01L 21/331
2134705  8/1984  United Kingdom ............. H01L 29/06

*Primary Examiner*—Ngân V. Ngô
*Attorney, Agent, or Firm*—Seed and Berry LLP; David V. Carlson

[57] ABSTRACT

A semiconductor device including a substrate having a first conductivity type on which are formed first and second epitaxial layers of the same conductivity type of the substrate. The semiconductor device also includes a first diffused region having a second conductivity type formed in a first portion of the first and second epitaxial layers. Said first diffused region defines a first junction with said first and second epitaxial layers. The semiconductor device also comprises an edge structure having the second conductivity type formed in a second portion of the first and second epitaxial layers. The edge structure includes a second diffused region having the second conductivity type formed in the first and second epitaxial layers, said second diffused region defining a second junction with said first and second epitaxial layers. The edge structure also includes a third diffused region of the same conductivity type of the second diffused region formed in the second epitaxial layer, said third diffused region being interposed between the first and the second diffuse regions and defining a third junction with said second epitaxial layer, said third junction being shallower than the first and the second junctions.

20 Claims, 6 Drawing Sheets 5,796,156

HIGH-VOLTAGE SEMICONDUCTOR DEVICE WITH INTEGRATED EDGE STRUCTURE AND ASSOCIATED MANUFACTURING PROCESS

BACKGROUND OF THE INVENTION

1. Field of the Invention

The present invention relates to high-voltage semiconductor devices with integrated edge structures and to associated manufacturing processes.

2. Description of the Related Art

Generally, high-voltage semiconductor devices including PN-type planar junctions must withstand high voltages with reverse bias. A typical example of PN-type planar junction is the base-collector junction of an NPN-type bipolar transistor.

In FIG. 1 is shown a PN-type planar junction designated by reference number 1 and included in a semiconductor device 2. The PN-type planar junction 1 is formed essentially by a first semiconductor region 3, e.g. a diffused region having a first conductivity type and in particular $P^+$-type, which is included in a second semiconductor region 4, e.g. an epitaxial layer having a second conductivity type and in particular $N^-$-type. Over these two regions is deposited an insulating oxide layer 5 on which are provided the metallic contacts 6 for electrical connection of the junction 1. Under conditions of reverse bias the junction 1 is surrounded by a charge depletion region 7 in which is present an electrical field which does not have uniform distribution.

Again with reference to FIG. 1, close to a flat portion 8 of the junction 1 the equipotential lines are parallel while close to an edge portion 9 of the junction 1, because of the finite dimensions of the latter, the equipotential lines are curved and much less spaced. This involves raising of the electrical field especially close to the surface of the semiconductor device 2. This high surface electrical field causes the breakdown voltage of the junction 1 to be less close to the edge portion 9 than close to the flat portion 8.

To reduce the electrical field present in the edge portion 9 there are used different known technical solutions. A common objective of these techniques is essentially that of modifying the dimensions of the depletion region 7 so as to prevent local increases in the electrical field from causing premature junction breakdown.

As shown in FIG. 2, a first solution of the prior art to satisfy this requirement calls for provision of so-called "metallic field plates" which are formed by extending the metallic contact 6 of the diffused region 3 over the insulation oxide layer 5. The metallic field plate, by acting as a shield, forces the equipotential lines to extend in a wider portion of the semiconductor device to aid reduction of the surface electrical field and consequent increase in the breakdown voltage of the edge portion 9.

Although advantageous in some ways this first technical solution of the prior art exhibits the shortcoming that at the edges of the metallic field plate the shielding action decreases with consequent increase in the surface electrical field.

A second solution of the prior art is described in U.S. Pat. No. 4,667,393 of the same applicant. It suggests providing close to the edge portion 9 an edge structure 10 comprising one or more so-called "high-resistivity rings", as shown in FIG. 3. The depletion region 7 is thus extended into a broader portion of the semiconductor device 2 to broaden the space charge distribution with resulting decrease in the surface electrical field. More specifically, the rings are provided inside the epitaxial layer 4 by implantation and diffusion of a dopant material having the first conductivity type and in particular $P^-$-type. By controlling the amount of implanted material and the diffusion process it is possible to achieve the desired resistivity.

When the semiconductor device 2 must withstand high voltages there are provided two or more concentric rings with resistivity decreasing from the inside outward. However, small rings depth to epitaxial layer thickness ratios are responsible for rather high surface electrical field values. These high surface electrical field are sensitive to the charges present near the device surface (moving charges and charges located at the interface between the insulating oxide layer 5 and the silicon). Local variations in the electrical field due to these charges can generate so-called walk out/walk in phenomena or conduction of channeled charges which make the edge structure 10 unsteady and precarious.

As shown in FIG. 4, by increasing the rings depth to epitaxial layer thickness ratio there are obtained rings with greater curve radii which improve the uniformity of the depletion region 7 and lower the surface electrical field values.

Thus there is provided another technical solution of the prior art, denominated "deep ring technique", capable of ensuring better stability of the edge structure 10.

With reference to FIG. 5, it is noted that the deep ring technique is based on the important result that the breakdown voltage of the junction 1 depends on the quantity $\Delta X = X_{j2} - X_{j1}$ where $X_{j1}$ is the junction depth of the junction 1 while $X_{j2}$ is the junction depth of a so-called "termination region" designated 11 incorporating the rings provided by the above mentioned technique. In the presence of termination regions with non-unitary edge efficiency, upon increasing the positive quantity $\Delta X$ the breakdown voltage of the junction 1 also increases. The edge structures provided in this manner have the advantage of making breakdown of the junction 1 independent of the diffused region 3 since the breakdown takes place in the termination region 11. Provision of termination regions with high junction depth involves the use of fast diffusers or long or high-temperature diffusion cycles in the case of slow diffusers. This makes the edge structure integration process very costly especially in the case of slow diffusers.

SUMMARY OF THE INVENTION

A principal object of the present invention is the provision of a high-voltage semiconductor device with integrated edge structure which is efficient and economical to manufacture.

The solution idea underlying the present invention is to place between a junction to be protected and a termination region a thin region of appropriate thickness and doping so as to achieve extension of the junction to be protected while simultaneously reducing its depth.

The preferred embodiment of the invention is implemented in a monolithic high-voltage semiconductor device including a substrate having a first conductivity type on which are formed first and second epitaxial layers of the same conductivity type of the substrate. The semiconductor device also includes a diffused region having a second conductivity type formed in a first portion of the first and second epitaxial layers, said diffused region defining a first junction with said first and second epitaxial layers. The semiconductor device further comprises an edge structure having the second conductivity type formed in a second portion of the first and second epitaxial layers. The edge structure includes a termination region having the second conductivity type formed in the first and second epitaxial layers, said termination region defining a second junction with said first and second epitaxial layers. The edge structure also includes a thin region of the same conductivity type of the termination region formed in the second epitaxial layer, said thin region being interposed between the diffuse region and the termination region and defining a third junction with said second epitaxial layer, said third junction being shallower than the first and the second junctions.

The features and advantages of the semiconductor device according to the present invention will become apparent from the following description of an embodiment thereof, given by way of example and not limitation, with reference to the accompanying drawings.

DETAILED DESCRIPTION OF THE PREFERRED EMBODIMENT

The figures of the accompanying drawings generally and schematically illustrate a high-voltage semiconductor device with integrated edge structure and an associated manufacturing process.

Figure 1:
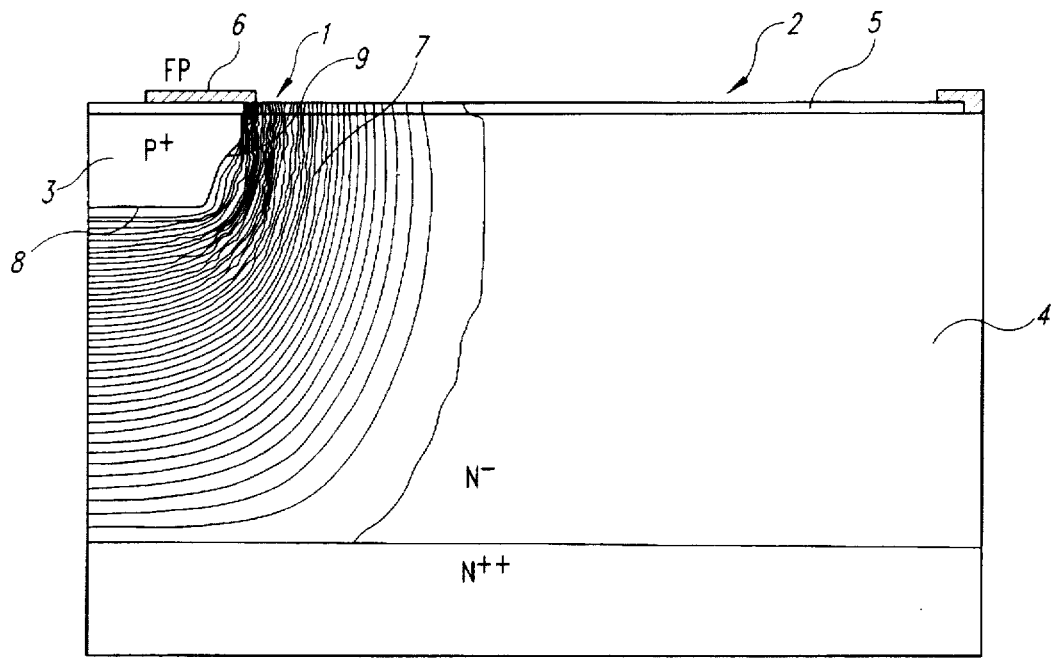
FIG. 1 is a vertical cross section in enlarged scale of a planar junction.
Figure 2:
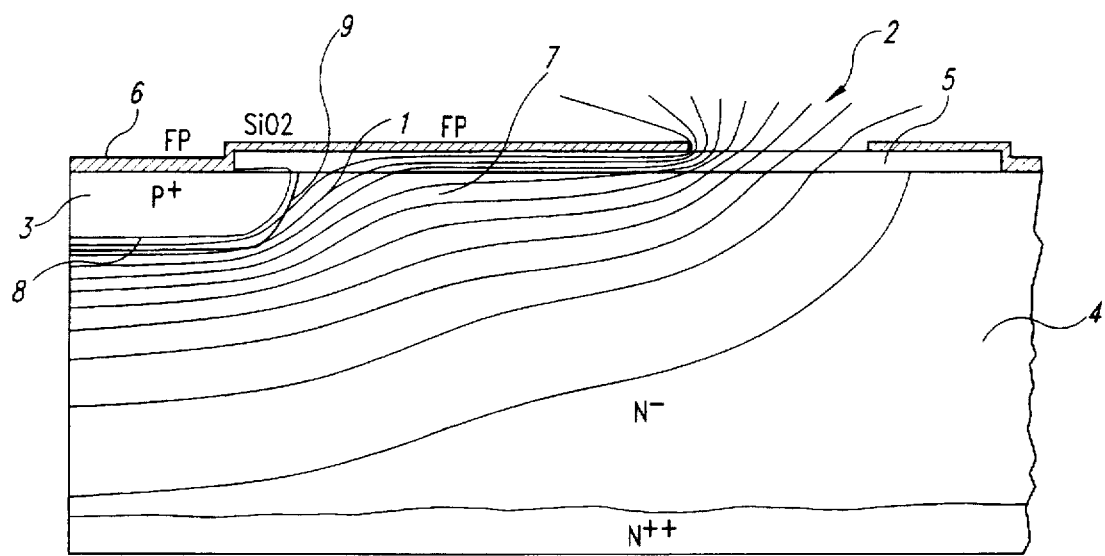
FIGS. 2 to 5 is vertical cross sections in enlarged scale of different embodiments in accordance with the prior art of an edge structure associated with the planar junction shown in FIG. 1.
Figure 3:
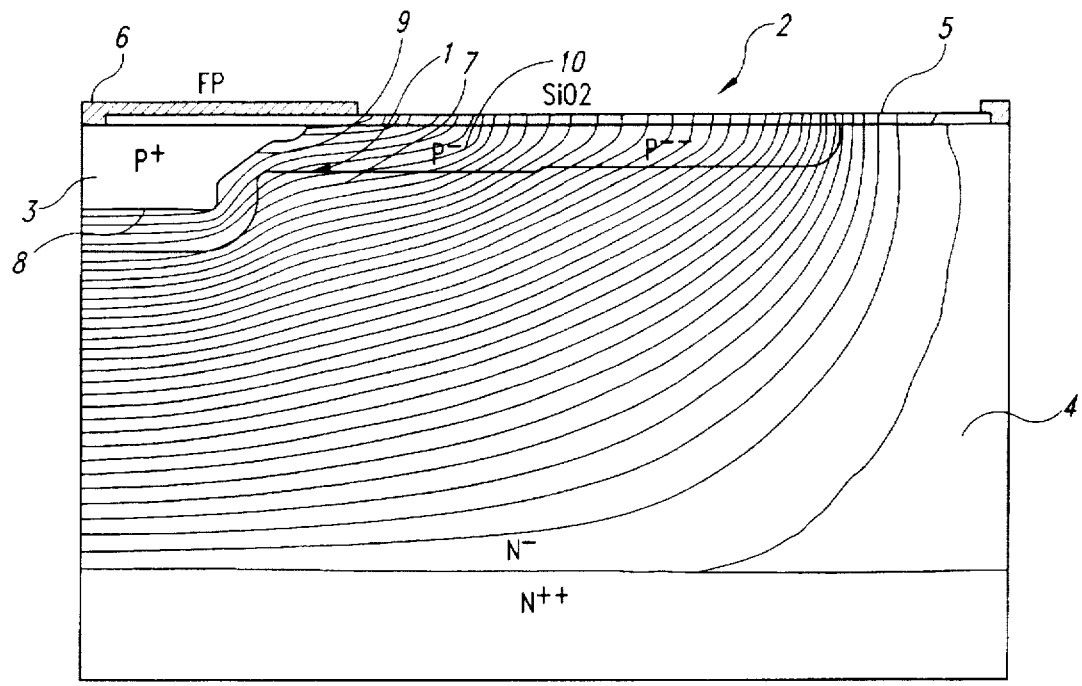
Figure 4:
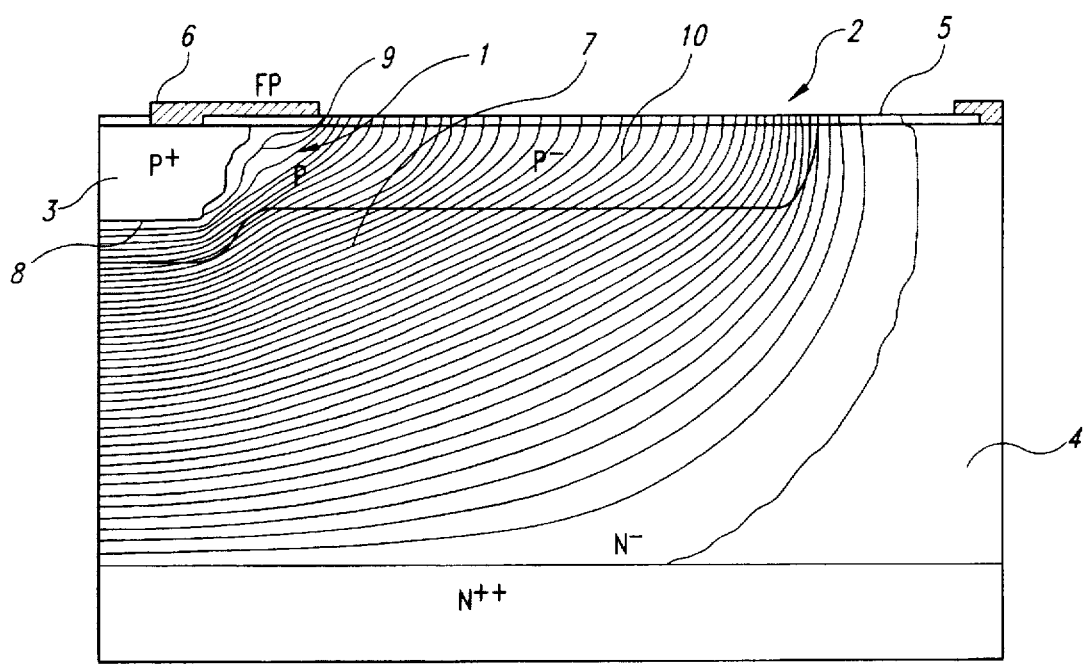
Figure 5:
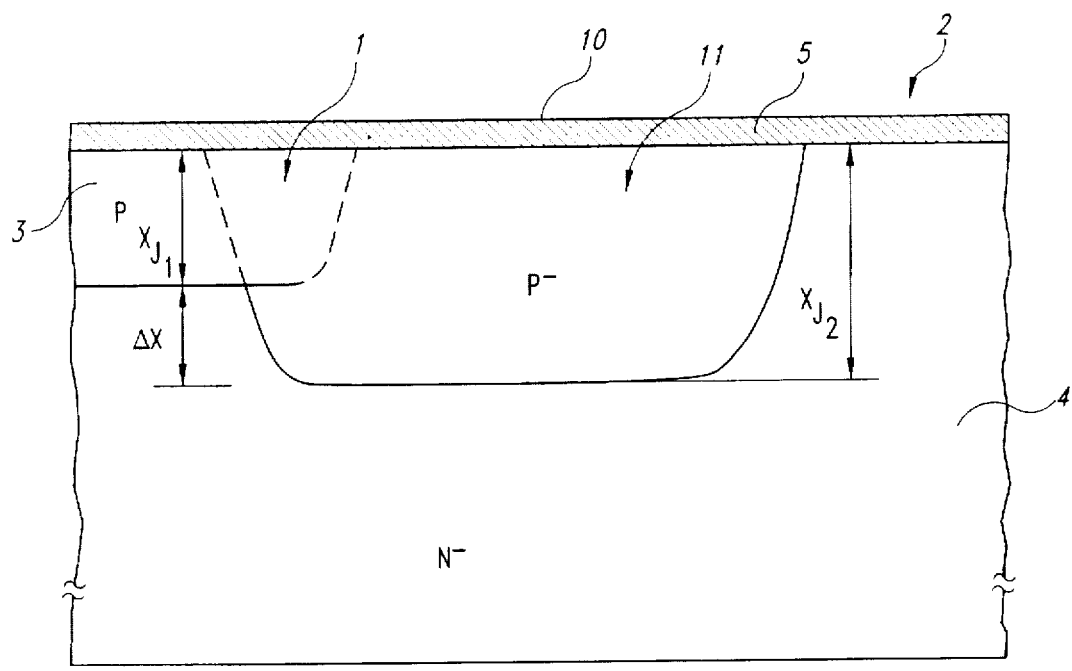
Figure 6:
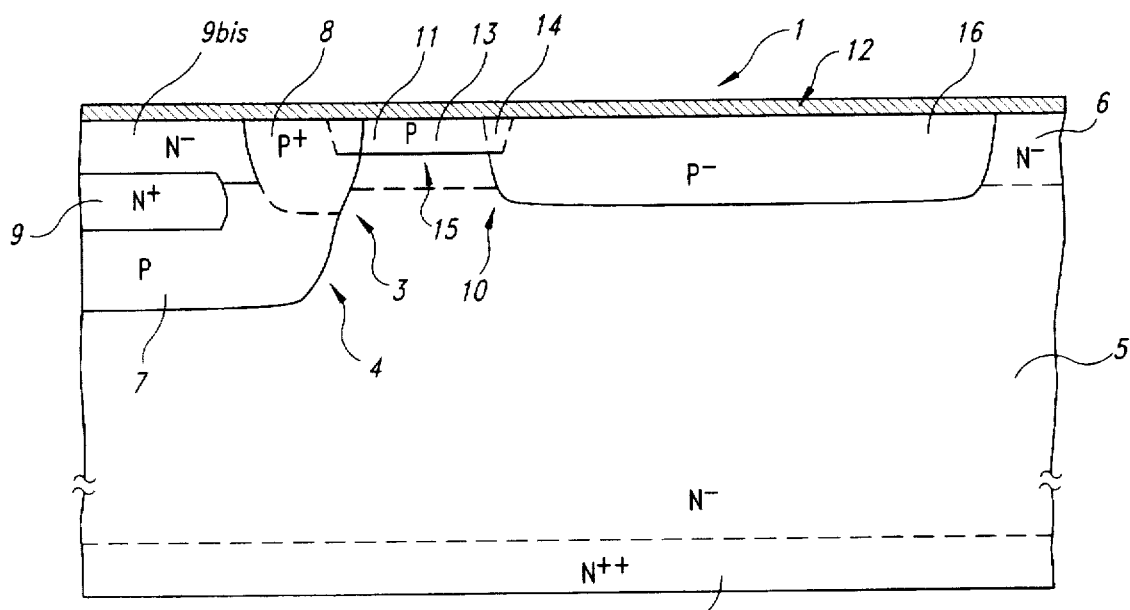
FIG. 6 is a vertical cross section in enlarged scale of a semiconductor device with incorporated edge structure provided in accordance with the invention.

With particular reference to FIG. 6, a preferred embodiment of the inventive semiconductor device is designated generally by reference number 1. The device 1 includes a substrate 2 of semiconductor material, e.g. silicon, having a first conductivity type and in particular $N^{++}$-type. Over the substrate 2 are formed respectively first 5 and second 6 epitaxial layers having the same conductivity type of the substrate 2 and in particular $N^-$-type. The first epitaxial layer 5 has a high resistivity and a considerable thickness to ensure the breakdown voltage of the device 1. The device 1 also includes a junction 3 provided by a diffused region 4 having a second conductivity type, and in particular P-type, which is formed in a first portion of the first 5 and the second 6 epitaxial layers. The diffused region 4 includes a buried region 7 having the second conductivity type, and in particular P-type, and a deep region 8 of the same conductivity type of the buried region 7, and in particular $P^+$-type. The deep region 8 contacts laterally the buried region 7 performing the connection of the buried region to the surface of the device 1. It is noted that in the case of high voltage devices (breakdown voltages comprised between 1000 V to 2000 V) performed using a well-known power integrated circuit technology in which the power stage is preferably of the vertical DMOS-type of structure, the buried region 7 should have a junction depth about ¼ to ⅓ the residual thickness of the first epitaxial layer 5 underlying the region.

Inside the diffused region 4, which is preferably annular in topology, is included a buried region 9 having the first conductivity type and in particular $N^+$-type. It is noted that the term "annular" is used herein to mean a closed region which preferably is rectangular or circular. The buried region 9 and the diffused region 4 isolate completely a portion designated 9bis of the second epitaxial layer 6 from the rest of the device 1. This portion 9bis is designed to receive a circuitry operating at low and/or high voltage.

Again with reference to FIG. 6 the device 1 also comprises an edge structure 10 formed in a second portion of the epitaxial layers 5 and 6 and adjoining an edge portion 11 of the junction 3. The edge structure 10 includes a termination region 12 having the second conductivity type, and in particular $P^-$-type, and a thin region 13 having the same conductivity type of the termination region 12, and in particular P-type. The thin region 13 is interposed between the edge portion 11 of the junction 3 and the termination region 12. Specifically, the thin region 13 is formed in the second epitaxial layer 6 and adjoins the edge portion 11 of the junction 3 and an edge portion 14 of the termination region 12. In addition, the thin region 13 is provided with appropriate thickness and doping to achieve an extension and a depth reduction of the junction 3.

The thin region 13 can also be provided with an inconstant and gradually decreasing resistivity as it approaches the termination region 12. The thin region 13 must be shallower than the termination region 12 so as to make more significant the difference between the junction depth of the termination region 12 and the junction depth of the junction 3. The thin region 13 is also capable of decoupling the electrical field created along the edge portion 11 of the junction 3 from the electrical field created along the edge portion 14 of the termination region 12 adjoining the thin region 13. The decoupling of this electrical fields occurs when the electrical field component parallel to a junction 15 formed by the thin region 13 and the second epitaxial layer 6 reaches virtually null values in the zone of the epitaxial layer 6 underlying the junction 15 for a depth dependent upon the ratio of the doping concentrations present in the thin region 13 to those present in the epitaxial layers 5 and/or 6. The width of the thin region 13 also depends on the ratio of its dopant concentration to the dopant concentration present in the edge portion 14 of the termination region 12. From another viewpoint effective decoupling of the electrical field is achieved when the structure of the termination region 12 is fixed and the dose and extension of the thin region 13 are combined in such a manner as to eliminate the critical nature of the gradient of the equipotential lines respectively on the edge portion 14 of the termination region 12 and on the edge portion 11 of the junction 3, whence can derive edge breakdown of the device 1.

Again with reference to FIG. 6, it is noted that if the termination region 12 is provided using material with high diffusivity, such as e.g. aluminium, the termination region 12 includes a diffused region 16 having high resistivity and the second conductivity type, and in particular $P^-$-type. Using termination regions provided in this manner and hence very deep, the thin region 13 can comprise two diffused regions having P-type conductivity. This two diffused regions are formed in the two epitaxial layers 5 and 6 in such a manner as to better protect the junction 3.

Figure 7:
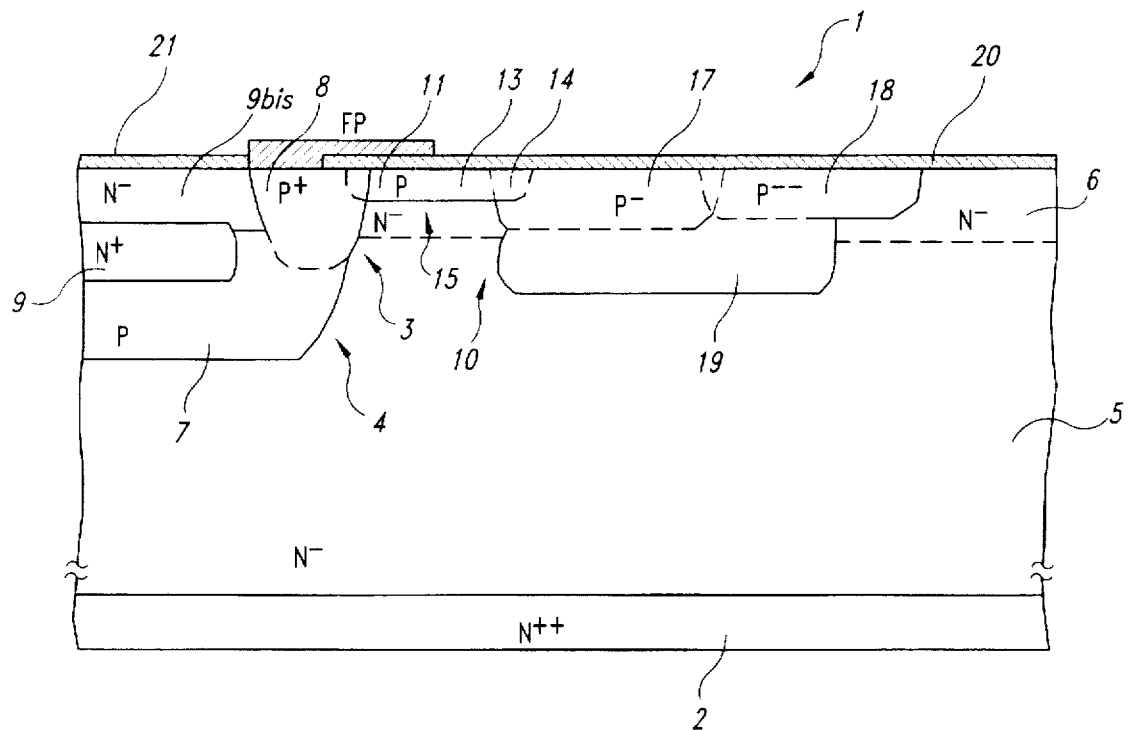
FIG. 7 show the semiconductor device of FIG. 6 with incorporated edge structure represented in a second and more general embodiment in accordance with the invention.

As show in FIG. 7, if the termination region 12 is provided using a material with lower diffusivity, e.g. boron, it can includes two diffused regions 17 and 18 having respectively $P^-$-type and $P^{--}$-type conductivities. This two diffused region have greater junction depth than the edge portion 11 of the junction 3. To further increase this junction depth beneath the two diffused regions 17 and 18 there can be provided a buried region 19 having the second conductivity type, and in particular P⁻-type. The two diffused regions 17 and 18 and the buried region 19 also have a high resistivity.

Again with reference to FIG. 7, over the surface of the device 1 is located an insulating oxide layer 20 on which is provided a metallic region 21 for contact of the junction 3.

Now described are the steps of the manufacturing process of the semiconductor device 1.

The manufacturing process of the semiconductor device 1 begins with growth of the first epitaxial layer 5 on the substrate 2. In the first epitaxial layer 5 is formed by implantation and successive diffusion heat treatment the buried region 7. Successively, in the first epitaxial layer 5 is formed by implantation and successive diffusion heat treatment the buried region 9. Over the first epitaxial layer 5 is then grown the second epitaxial layer 6 in which is implanted and successively diffused the deep region 8 to permit electrical continuity with the buried region 7.

The integration process of the device 1 continues with provision of the edge structure 10. The thin region 13 which ensures electrical continuity between the junction 3 and the termination region 12 is provided in an intermediate step between formation of the second epitaxial layer 6 and formation of the deep region 8. This intermediate step includes an implantation and a successive dedicated diffusion heat treatment. The thin region 13 can also be formed in successive steps by using implants and heat cycles necessary for provision of the circuitry incorporated in the portion 9bis of the second epitaxial layer 6. For provision of the thin region 13 there can further be used variable transparency solutions.

As concerns the provision of the termination region 12 different process variants are possible. Specifically, if a high-diffusivity dopant material is used the termination region 12 is formed by implantation and successive diffusion heat treatment of the diffused region 16. If the material used has lower diffusivity the termination region 12 is formed by implantation and successive diffusion heat treatment of the two diffused regions 17 and 18. In this manner the termination region 12 is always deeper than the thin region 13 in the part contiguous therewith. In this regard it is possible to use the same heat treatment used to diffuse the deep region 8 after use of dedicated implantation in the desired regions.

Furthermore, if it is desired to improve the characteristics of the edge structure 10 there can be achieved e.g. relatively deep diffused regions using the first epitaxial layer 5. Indeed, in accordance with the criteria of the prior art, by dedicated implantation and successive diffusion heat treatment to be performed on this first epitaxial layer 5, there can be provided one or more buried regions such as e.g. the buried region 19. The only condition to be observed for this purpose is that after completion of the edge structure 10 electrical continuity be assured between the regions integrated respectively on the first and second epitaxial layers (diffuse regions 17 and 18 and buried region 19).

For the termination regions of the above described type the known variable transparency technique can be used by appropriately modifying the layouts defining formation of the diffused regions to achieve more elaborate edge structures.

After completion of the termination region 12 the integration process of the device 1 proceeds in accordance with the known integrated power device manufacturing techniques.

In conclusion the device 1 in accordance with the present invention comprises an edge structure 10 which exhibits the characteristics called for by integration of termination regions in accordance with the above mentioned known techniques while not necessarily having recourse to integration of termination regions with extremely deep junctions.

An example of an edge structure comprising a termination region provided as in FIG. 7 was simulated by including provision of the thin region 13 in the intermediate step between formation of the second epitaxial layer 6 and formation of the deep region 8.

Figure 8:
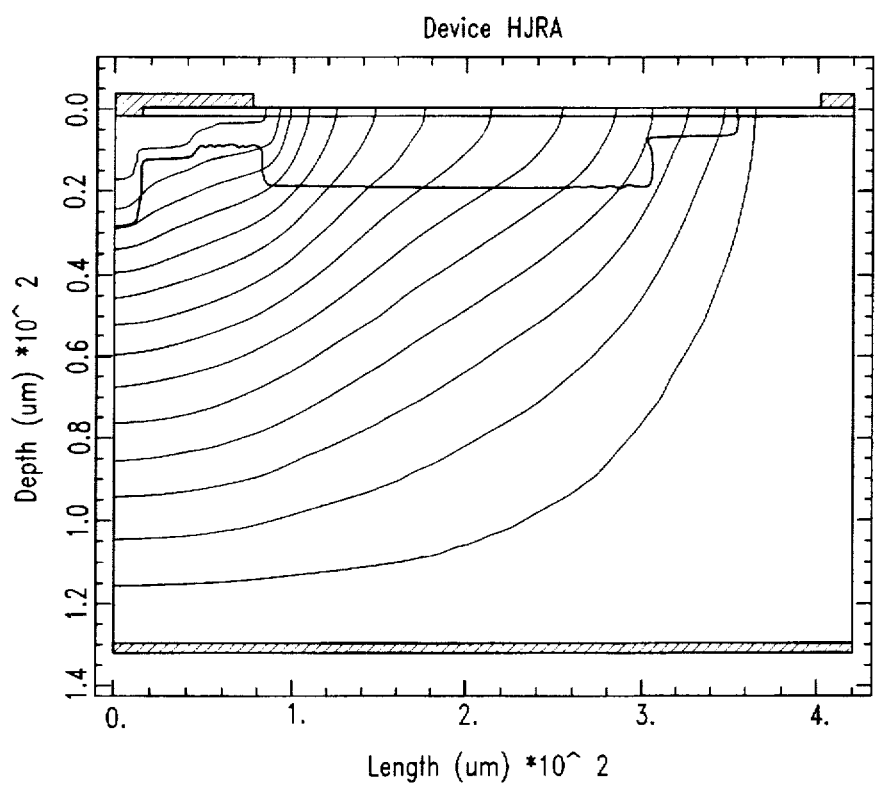
FIGS. 8 to 10 show different behaviors of the equipotential lines inside of the semiconductor device of FIG. 6 and FIG. 7.

FIG. 8 shows the simulated edge structure with hatching while the junction portion belonging to the thin region 13 is shown with crosses. In the same FIG. are also shown the equipotential lines spaced 50 V apart, e.g. for the case of a substrate dimensioned for 1500 V and biased at this voltage. It is important to note that near the thin region 13 the equipotential lines remain virtually parallel with the surface of the device 1 while the potential increases mainly beneath the junction 3 to ensure breakdown close to the flat portion of the junction.

Figure 9A:
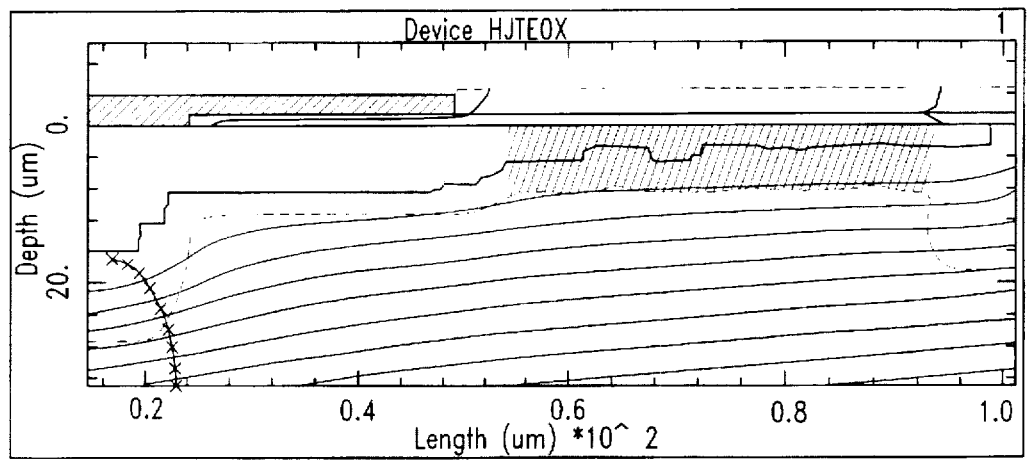
Figure 9B:
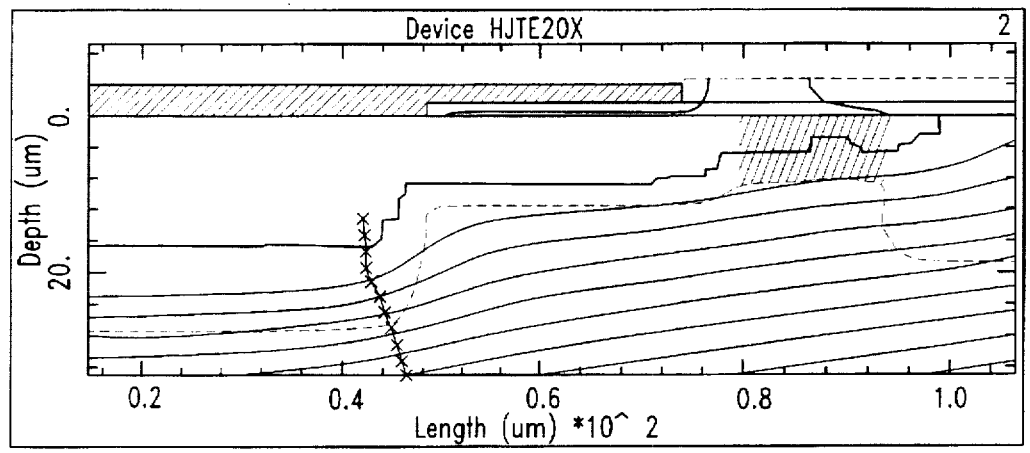
Figure 9C:
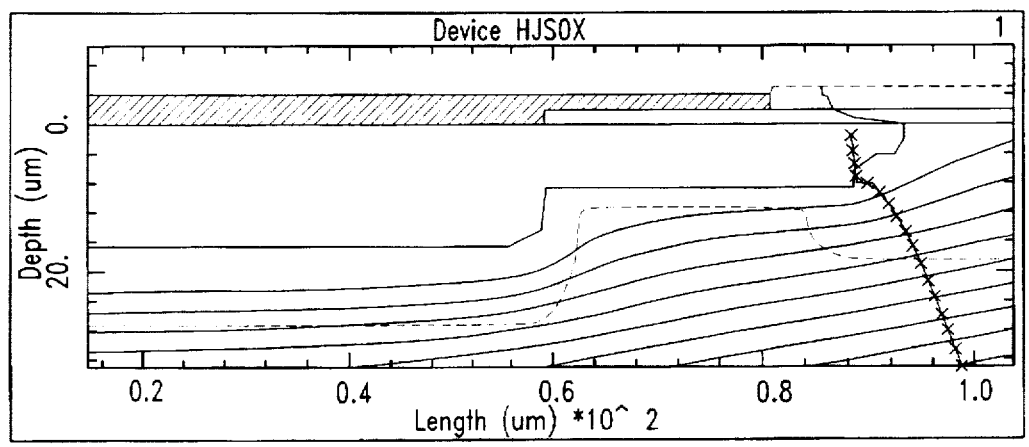

In FIGS. 9 through 9b are reproduced in detail the simulated behaviors of the equipotential lines in the thin region 13. The three graphs concern the same edge structure in which, from top to bottom, the width of the thin region 13 is that specified, half or absent. From the FIGS. it appears clearly that the equipotential lines tend rapidly to deflect toward the edge portion 14 of the termination region 12 where the extension of the thin region 13 is reduced to less than 30 μm. In parallel the location of the maximum electrical field passes from the corner of the junction 3 to the transition point between the thin region 13 and the termination region 12 to procure breakage of the edge structure as shown by a crossed line. Again, since behind the edge portion 14 of the termination region 12 the electrical field is reduced the depletion region formed outside the junction 3 when it is reverse biased essentially affects the termination region 12 without involving the thin region 13.

Figure 10:
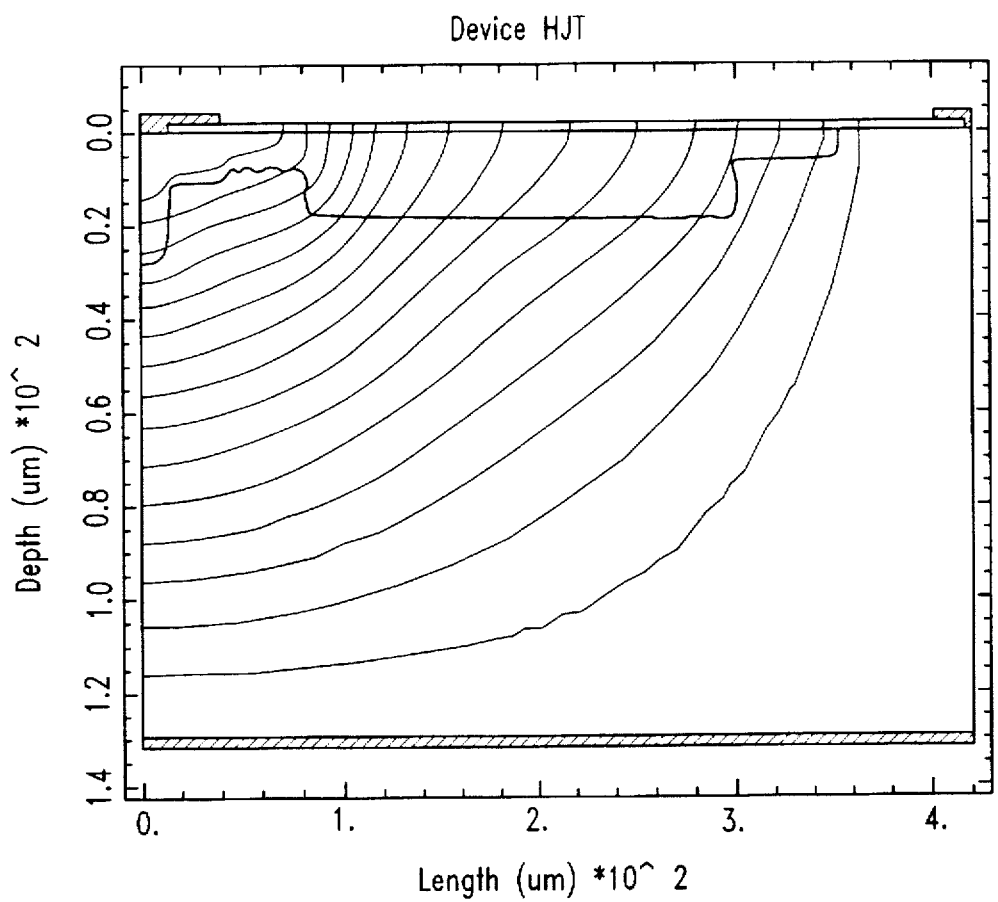

Marginally to these simulations it was also verified that the presence of a metallic field plate has no influence on the behavior of the potential in the thin region 13 as may be inferred by comparison of FIG. 8 with FIG. 10 for an edge structure having a short field plate.

Finally, recourse to the thin region 13 appears to be a valid option because it allows reduction of the extension of the termination region 12 while keeping its edge efficiency.

What is claimed is:

1. An high-voltage semiconductor device including:
   a substrate having a first conductivity type;
   a first epitaxial layer of the same conductivity type of the substrate formed over the substrate;
   a second epitaxial layer of the same conductivity type of the substrate formed over the first epitaxial layer;
   a first diffused region having a conductivity type formed in a first portion of the first and second epitaxial layers, said first diffused region defining a first junction with said first and second epitaxial layers; and
   an edge structure having the second conductivity type formed in a second portion of the first and second epitaxial layers, wherein said edge structure includes:
   a second diffused region having the second conductivity type formed in the first and second epitaxial layers, said second diffused region defining a second junction with said first and second epitaxial layers; and a third diffused region of the same conductivity type of the second diffused region formed in the second epitaxial layer, said third diffused region being interposed between and adjoining the first and the second diffused regions and defining a third junction with the second epitaxial layer, said third junction being shallower than the first and the second junctions.

2. The semiconductor device of claim 1, wherein the third diffused region is thinner than the first and the second diffused regions.

3. The semiconductor device of claim 1, wherein the third diffused region has a length dependent upon the dopant material concentration of the first and second diffused regions.

4. The semiconductor device of claim 1, wherein the third diffused region has a resistivity selected depending upon the dopant material concentration of the first and second diffused regions.

5. The semiconductor device of claim 4, wherein the resistivity of the third diffused region is greater than the resistivity of the first diffused region.

6. The semiconductor device of claim 4, wherein the resistivity of the third diffused region is lower than the resistivity of the second diffused region.

7. The semiconductor device of claim 1, wherein the second diffused region includes at least two diffused regions having the second conductivity type and provided inside the first and the second epitaxial layers.

8. The semiconductor device of claim 1, wherein said second conductivity type is P.

9. A process for manufacturing a semiconductor device including:

a substrate having a first conductivity type;

a first epitaxial layer of the same conductivity type of the substrate formed over the substrate;

a second epitaxial layer of the same conductivity type of the substrate formed over the first epitaxial layer;

a first diffused region having a second conductivity type formed in a first portion of the first and second epitaxial layers, said first diffused region defining a first junction with said first and second epitaxial layers; and an edge structure having the second conductivity type formed in a second portion of the first and second epitaxial layers, wherein said edge structure includes a second diffused region having the second conductivity type formed in the first and second epitaxial layers, said second diffused region defining a second junction with said first and second epitaxial layers, and wherein the process includes the step of:

forming a third diffused region having the second conductivity type in the second epitaxial layer, said third diffused region being interposed between and adjoining the first and the second diffused regions and defining a third junction with said second epitaxial layer, said third junction being shallower than the first and the second junctions.

10. The process of claim 9, wherein the third diffused region is formed by implantation and successive diffusion heat treatment.

11. The process of claim 9, wherein the third diffused region has a P-type conductivity.

12. A monolithic high-voltage semiconductor device including:

a substrate having a first conductivity type;

a first epitaxial layer of the same conductivity type of the substrate formed over the substrate;

a second epitaxial layer of the same conductivity type of the substrate formed over the first epitaxial layer;

a diffused region having a second conductivity type formed in a first portion of the first and second epitaxial layers, said diffused region defining a first junction with said first and second epitaxial layers; and an edge structure having the second conductivity type formed in a second portion of the first and second epitaxial layers, wherein said edge structure includes:

a termination region having the second conductivity type formed in the first and second epitaxial layers, said termination region defining a second junction with said first and second epitaxial layers; and a thin region of the same conductivity type of the termination region formed in the second epitaxial layer, said thin region being interposed between and adjoining the diffused region and the termination region and defining a third junction with said second epitaxial layer, said third junction being shallower than the first and the second junctions.

13. The semiconductor device of claim 12, wherein the thin region is thinner than the diffused region.

14. The semiconductor device of claim 12, wherein the thin region is thinner than the termination region.

15. The semiconductor device of claim 12, wherein the thin region has a length dependent upon the dopant material concentration of the diffused region and of the termination region.

16. The semiconductor device of claim 12, wherein the thin region has a resistivity selected depending upon the dopant material concentration of the diffused region and of the termination region.

17. The semiconductor device of claim 16, wherein the resistivity of the thin region is greater than the resistivity of the diffused region.

18. The semiconductor device of claim 16, wherein the resistivity of the thin region is lower than the resistivity of the termination region.

19. The semiconductor device of claim 12, wherein the termination region includes at least two diffused regions having the second conductivity type and provided inside the first and the second epitaxial layers.

20. The semiconductor device of claim 12, wherein said second conductivity type is P.

* * * * *